United States Patent [19]

Hulseweh

[11] Patent Number: 4,614,021
[45] Date of Patent: Sep. 30, 1986

[54] PILLAR VIA PROCESS

[75] Inventor: Terry S. Hulseweh, Mesa, Ariz.

[73] Assignee: Motorola, Inc., Schaumburg, Ill.

[21] Appl. No.: 717,343

[22] Filed: Mar. 29, 1985

[51] Int. Cl.[4] .......................................... H01L 21/312
[52] U.S. Cl. ...................................... 29/590; 29/591; 29/578; 156/643; 357/71
[58] Field of Search ................. 29/589, 590, 591, 578; 357/71; 156/646, 643, 661.1; 148/DIG. 131

[56] References Cited

U.S. PATENT DOCUMENTS

| | | | |
|---|---|---|---|
| 4,172,004 | 10/1979 | Alcorn et al. | 29/591 |
| 4,184,909 | 1/1980 | Chang et al. | 156/643 |
| 4,288,283 | 9/1981 | Umezaki et al. | 156/643 |
| 4,426,249 | 1/1984 | Brown et al. | 156/661.1 |
| 4,486,946 | 12/1984 | Jopke, Jr. et al. | 29/590 |
| 4,501,061 | 2/1985 | Wonnacott | 29/590 |
| 4,523,372 | 6/1985 | Balda et al. | 29/590 |
| 4,541,168 | 9/1985 | Galie et al. | 29/591 |
| 4,541,169 | 9/1985 | Bartush | 29/591 |

Primary Examiner—Brian E. Hearn
Assistant Examiner—Hunter L. Auyang
Attorney, Agent, or Firm—Robert M. Handy

[57] ABSTRACT

An improved means and method is described for providing a conductive pillar in a via between multiple layers of conductors on planar electronic structures such as integrated circuits. A lower first conductor layer is formed on the device substrate and covered with an electrically conducting etch-stop layer and a second conductor layer. The second conductor layer is masked to define the conductive via and etched selectively and anisotropically until the etch-stop layer is reached. The exposed portions of the etch-stop layer are then removed. The remaining portions of the etch-stop layer and second conductor layer together form the conductive pillar. The lower first metal layer is patterned and then covered with a planarizing layer, such as a polyimide, having a thickness at least equal to the height of the pillar. The planarizing layer is uniformly etched to expose the top of the pillar and then an upper metal layer deposited over the remaining polyimide and in contact with the top of the pillar. The remaining polyimide acts as the interlayer dielectric.

22 Claims, 14 Drawing Figures

PILLAR VIA PROCESS

FIELD OF INVENTION

This invention relates in general to electronic devices and, more particularly, to planar devices having multiple layers of metalization connected by conductive vias passing between the layers.

BACKGROUND ART

It is commonplace in the electronic art, particularly the semiconductor art to use multiple layers of conductors to interconnect different devices or device regions. For example, power and ground may be distributed on one layer of interconnections while signals are distributed on a different layer or, all the interconnections on a first layer may be aligned in a first direction while the interconnections on a second layer are aligned in a second direction at right angles to the first direction. Multiple conductor layers permit more compact device and circuit layouts.

The conductors are typically of metal although semiconductors and other conductive materials are also employed. As used herein the words "metal, metalization, conductor, conductive, or conducting" whether used singly or in combination with the prefix "multi-" or the words "multi-layer" are intended to refer to any conductive material, including, but not limited to metals, semiconductors, semimetals, and intermetallics.

The multiple metal layers are separated by dielectric insulating layers except at particular points where conductive vias must be provided. Often the via is merely an opening in the intervening dielectric layer through which the upper metal layer penetrates so that it locally contacts the lower metal layer. Sometimes a conductive pillar or column is provided in the via hole for interconnecting the upper and lower metal layers.

Multi-layer metal arrangements and methods are known in the semiconductor art. However, prior art arrangements and methods suffer from a number of problems and disadvantages. For example, it is important that the surfaces of the successive conductor and dielectric layers be smooth and free from cracks and steps since such features produce weak points in the overlying layers which adversely affect device yield and reliability. In order to avoid step coverage problems at the edge of via holes in the dielectric layers, the via holes in the prior art have frequently been tapered before applying the next metal layer. But, tapered via holes occupy greater device area and are therefore undesirable for high density structures.

Other problems often arise during fabrication of multi-layer metal structures due to the fact that via and conductor etching usually does not proceed with complete uniformity, that is, one location on the wafer or substrate may etch more rapidly than another. This has the result that some vias or pillars are over-etched while others are under-etched. Thus, vias which are intended to have the same width or pillars which are intended to have the same height will be of different size and those intended to be of different size may be of virtually the same size. Such problems are particularly severe when very small vias and pillars must be used or different size vias and pillars must be present on the same substrate.

An additional weakness of prior art techniques is that the first or lower metal layer is often attacked by etchants during the fabrication of the interconnecting vias and overlying metal layers. This can locally erode the first metal layer and adversely affect manufacturing yield and reliability.

Accordingly, it is an object of the present invention to provide improved means and methods for forming conductive pillars joining otherwise isolated conductor layers on planar electronic devices and circuits, particularly semiconductor integrated circuits.

It is a further object of the present invention to provide an improved means and method for conductive pillars between superposed metal layers wherein the pillars can all have the same height and predetermined lateral dimensions.

It is an additional object of the present invention to provide an improved means and method for forming conductive pillars between superposed conductor layers wherein the pillars have lateral dimensions of the same order as the thickness of the dielectric layer isolating the superposed conductors.

It is a further object of the present invention to provide the above features by a method which is insensitive to non-uniformities in etching across the wafer or other substrate.

It is an additional object of the present invention to provide conductive pillars between superposed conductor layers wherein the first conductor layer is protected from harmfull etching during formation of the conductive vias and pillars and the overlying conductor layers.

SUMMARY OF THE INVENTION

The attainment of the foregoing and other objects and advantages is achieved wherein a conductive etch-stop region is provided in the conductive via interconnecting a lower and upper conductor layer.

There is further provided a method for fabricating conductive pillars in vias between lower and upper metal layers comprising, providing a lower first metal layer, providing a second metal layer above the first metal layer, providing between the first and second metal layers an intermediate layer composed of a conductive material which is selectively etchable with respect to the first metal layer and which is adapted to act as an etch-stop during etching of the second conductor layer, protecting the second metal layer with an etch mask having an open region and a closed region, selectively etching using an anisotropic etching means that part of the second metal layer exposed in the open region and stopping at the etch-stop layer, selectively etching the exposed portion of the etch-stop layer and stopping at the first metal layer, removing the etch mask, covering the exposed portions of the first and second metal layers and the etch-stop layer with a planarizing insulating dielectric having a thickness at least equal to the combined thickness of the second metal layer and the etch-stop layer, uniformly removing the surface of the planarizing layer until the top surface of the second metal layer is exposed, and forming an upper metal layer on the planarizing layer and in contact with the second metal layer. The first and second metal layers are conveniently of the same material. The upper metal layer may be of any conductive material making ohmic contact with the second metal layer. The second metal layer and the etch-stop layer must be differentially etchable. The etch-stop layer and the first metal layer are desirably differentially etchable.

The first metal layer is conveniently patterned to provide the desired conductor runs prior to application of the planarizing dielectric layer but may be patterned earlier, including prior to forming the intermediate or second metal layer. The upper metal layer is conveniently patterned after being deposited on the insulating planarizing layer.

The planarizing dielectric layer can be a single dielectric layer of an insulating material having planarizing properties. Alternatively, a double layer can be used, that is, a first insulating layer which need not be of a planarizing type covered by a second layer of a planarizing type. Where the double layer is used it is desirable that the first insulating layer be at least as thick as the combined thickness of the etch-stop layer and the second metal layer. When the double layer is used, it should be etched by an etching means which etches the planarizing layer at substantially the same rate as it etches the insulating layer.

These and other features of the present invention are further explained in the figures and description which follow.

DETAILED DESCRIPTION OF THE DRAWINGS

Figure 1A:
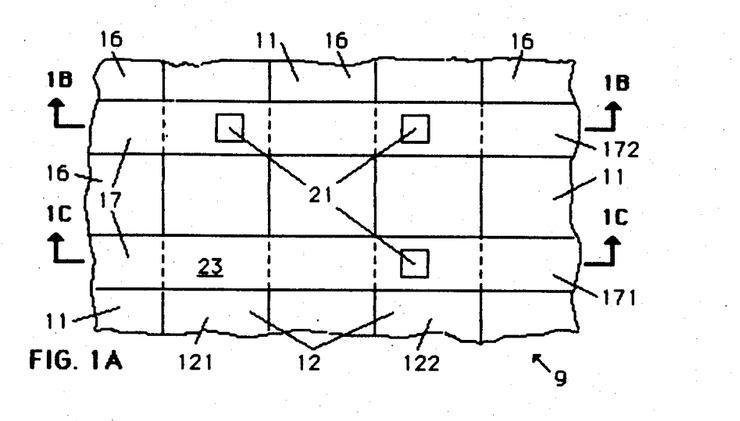
FIG. 1A is a simplified top view in schematic form of a portion of an electronic device employing multiple layers of conductors.
Figure 1B:
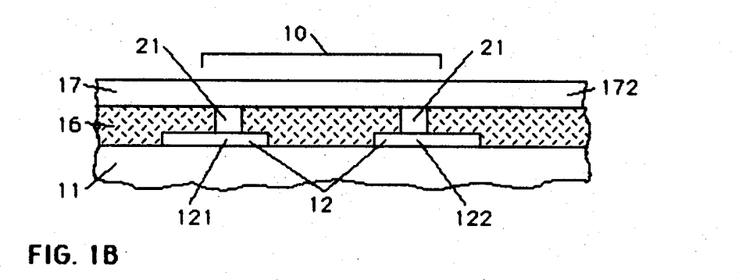
FIG. 1B is a simplified cross-section, along a first line, of the device of FIG. 1A.
Figure 1C:
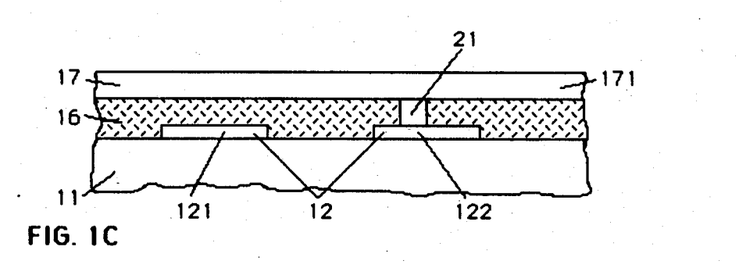
FIG. 1C is a simplified cross-section, along a second line, of the device of FIG. 1A.

FIG. 1 shows a simplified top view of a portion of an electronic device employing two conductor layers. Substrate 11 has thereon lower conductors 12 running vertically and superposed upper conductors 17 running horizontally. Conductors 12 and 17 are separated by dielectric layer 16 so as to be electrically isolated except at vias 21. Dielectric layer 16 is transparent in FIG. 1A. Conductive vias 21 have the form of columns of metal or other conductive material interconnecting conductors 12 and 17 at selected points where they cross-over each other. Conductor 121 is connected to conductor 172 and conductor 122 is connected to conductors 171 and 172. It will be noted that cross-over location 23 has no interconnecting via or pillar. Thus conductors 121 and 171 are not directly connected. FIGS. 1B-C are cross-sections through FIG. 1 at different locations showing the presence or absence of conductive vias or pillars 21.

Figure 2A:
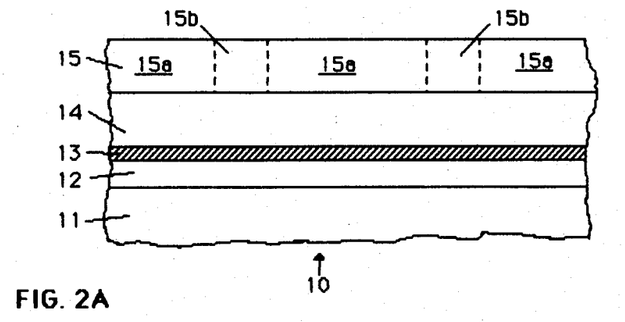
FIGS. 2A-H are cross-sections in simplified and schematic form of the central portion of FIG. 1B, somewhat enlarged and showing greater detail, during various stages of fabrication.

FIGS. 2A-H show, in simplified schematic form, central portion 10 of FIG. 1B during different stages of fabrication and somewhat enlarged so as to provide greater detail. In FIG. 2A, substrate 11, which may be any planar electronic device or integrated circuit requiring multi-layer interconnections, has thereon lower first conductor or metal layer 12. First metal layer 12 is covered by conductive etch-stop layer 13 which is in turn covered by second conductor layer 14. Means for forming layers 12, 13, and 14 are well known in the art. Etch-stop layer 13 and second conductor layer 14 will be shaped to form a conducting pillar between lower metal layer 12 and upper metal layer 17, as shown in the finished structure in FIG. 2H. Dielectric layer 16b (FIG. 2H) separates layers 12 and 17 and surrounds conductive pillar 21.

Layer 12 is desirably of a material which can be selectively etched relative to layer 13, that is etched by a means which does not significantly attack layer 13. Layer 12 should also be highly conductive. When substrate 11 comprises silicon or dieletric coated silicon, layer 12 is conveniently of an Al:Cu:Si alloy in the proportions (97.5%)Al:(1%)Cu:(1.5%)Si, although other conductive materials can also be used. When very fine device dimensions are required, layer 12 is desirably of thickness in the range 0.5-1.0 microns, with 0.6-0.9 microns being convenient and 0.7-0.8 microns being preferred. Larger thicknesses can be used but are more difficult to fabricate in narrow widths. When thicknesses less than about 0.5 microns are used undesirable coverage, pinhole, and resistance effects are encountered.

Layer 13 must be formed of a material which resists etching by etching means which attack second metal layer 14, hence its designation as an etch-stop layer. Etch-stop layer 13 is also desirably formed of a material which can be selectively etched relative to first metal layer 12, that is, etched by a means which does not significanly attack metal layer 12. Layers 13 and 14 should be highly conductive, but in general need not be as conductive as layers 12 and 17, since current flow is generally through the thickness of layers 13 and 14 rather than in the plane of the layers, as it is in the case of layers 12 and 17. Thus, the resistivity of the materials of layers 13 and 14 has less impact on the series resistance of the multi-layer conductors than the resistivity of layers 12 and 17.

When Al:Cu:Si is used for layer 12, layer 13 is conveniently of Ti:W in the proportions 82%:18%, although other combinations or materials having the above described properties can also be used. Generally, layer 13 should be as thin as is possible without having significant numbers of pinholes. Once the thickness of layer 13 is sufficient to provide a substantially pinhole free etch-stop layer, there is no advantage to making layer 13 thicker. It has been found that satisfactory results are obtained when layer 13 has a thickness in the range 0.1-0.5 microns, with 0.15-0.3 microns being more useful and 0.2-0.25 micron being preferred. If greater layer-to-layer spacing is desired between conductor layers 12 and 17, either or both of layers 13 and 14 can be made thicker, but it is preferable to thicken layer 14.

Layer 14 must be of a material which can be selectively etched relative to layer 13, that is etched by a means which does not significantly attack layer 13. Layer 14 should also be highly conductive. When substrate 11 comprises silicon or dielectric coated silicon, layer 14 is conveniently of the same material as layer 12, although other conductive materials can also be used. For devices having very small lateral dimensions, layer 14 is typically of thickness in the range 0.7-3.0 microns, with 1.0-2.0 microns being convenient and 1.2-1.6 microns being preferred. Larger thicknesses can be used but are more difficult to fabricate in narrow widths. When thicknesses less than about 0.5 microns are used undesirable coverage, pinhole, and resistance effects are encountered.

Figure 2B:
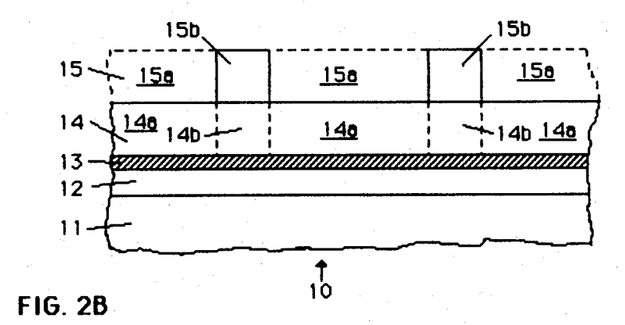

Layer 15 is a masking layer formed on layer 14 and having a soluble part that is removed (FIG. 2B) to form open region 15a and an insoluable part which remains to form mask region 15b. Photoresists are suitable for layer 15, but other masking materials can also be used. Means for forming resists or other masking layers are well known in the art. Layer 15 is conveniently of thickness in the range 1.5–2.0 microns. Layer 15 is patterned and developed using standard techniques to form mask portion 15b and open portion 15a (FIG. 2B).

Figure 2C:
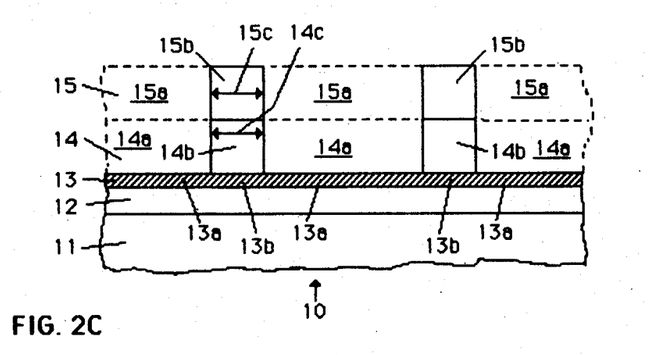
Figure 2D:
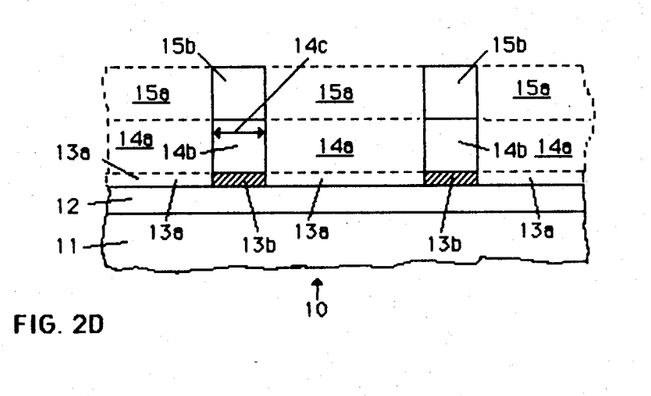
Figure 2E:
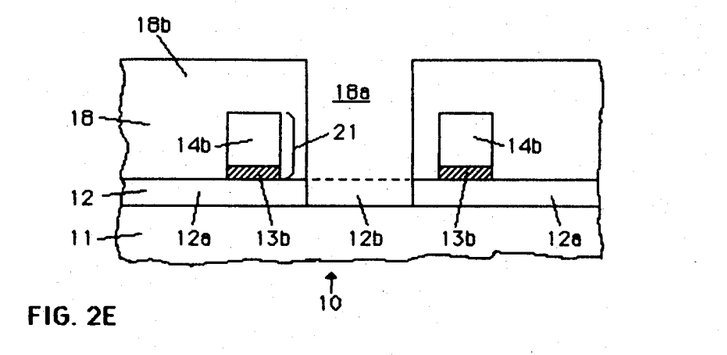
Figure 2F:
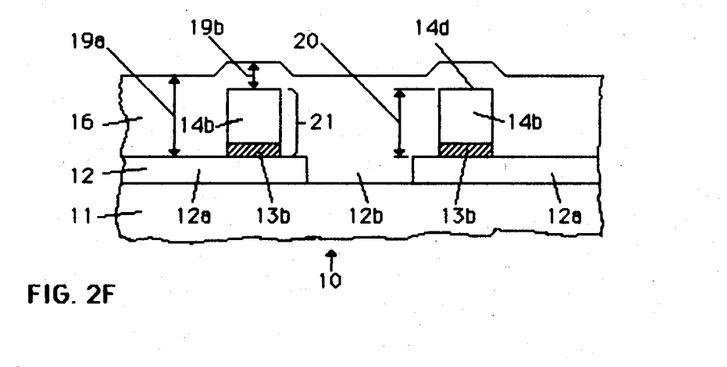

Exposed region 14a of layer 14 is then etched anisotropically and selectively (FIG. 2C), i.e., etched with little or no undercutting of protected portion 14b under mask portion 15b using etchants that attack the material of layer 14 preferetially as compared to the material of etch-stop layer 13. Anisotropic etching is used so that width 14c of pillar 14b remains substantially equal to width 15c of mask region 15b and is not substantially undercut. This is essential when it is desired to form conductive vias which have lateral dimensions of the same order as the thickness of layer 14 or of the same order as the thickness of dielectric layer 16b (FIG. 2H). Conductive vias having lateral dimensions of the order of 1–3 microns are needed for the fabrication of very complex high density devices and circuits. If isotropic etching is used, width 14c of pillar 14b will vary significantly across substrate 11 due to unavoidable variations in the etch rate. This adversely affects device yield, performance, and reliability. Selective etchants are used so that portion 14a of layer 14 can be etched without attacking underlying portion 13a of layer 13. This permits portion 14a to be etched to completion all across substrate 11, despite localized non-uniformities in etch rate and avoids a significant problem with some prior art approaches.

Region 14a is conveniently anisotropically and selectively etched using reactive ion etching (RIE) techniques. Suitable RIE equipment is the type AME 8130 RIE etcher manufactured by Applied Materials, Inc., Santa Clara, Calif. When layer 14 is of Al:Cu:Si and layer 13 is of Ti:W, in the proportions indicated above, an etch gas mixture comprising 10 parts $Cl_2$, 60 parts $BCl_3$, 5 parts $O_2$, and 10 parts $CHF_3$, measured in cc/min. of flow rate, gives an adequate etch rate for the Al:Cu:Si material of layer 14 while having a low etch rate for the Ti:W material of layer 13. An etch rate ratio of 10/1 or larger for etching Al:Cu:Si as compared to Ti:W is obtained. An etch rate ratio of at least 5/1 is desirable. Etching is continued until portion 13a of layer 13 under open region 15a is completely exposed.

Exposed portion 13a is then etched. It is preferable that this etching step also be carried out anisotropically and selectively, that is, without significant undercutting of protected portion 13b and without significant attack upon portion 12a of layer 12 underlying portion 13a. However, since layer 13 is thinner than layer 14, etching anisotropy is not as important in avoiding undercutting of an amount that is significant compared to lateral dimension 14c of the conductive via. FIG. 2D shows the results of using selective and anisotropic etching so that portion 13b of layer 13 has the same dimensions as mask 15b and region 14b, and so that region 12a of layer 12 under open region 15a is completely exposed.

Portion 13a is conveniently etched in the same apparatus as for region 14a, but using a gas mixture comprising, in cc/min. of flow rate, 5 parts $O_2$ and 40 parts $CF_4$. The RIE apparatus provides anisotropic etching and this gas mixture gives an etch rate ratio of 20/1 for etching the Ti:W material of layer 13 as compared to the underlying Al:Cu:Si material of layer 12 or the exposed Al:Cu:Si material of layer 14 on the sides of region 14b. An etch rate ratio of at least 5/1 is desirable.

Etching of exposed portion 13a is continued until exposed portion 13a has cleared everywhere. Prolonging the etching to be sure that the exposed portion 13a of layer 13 has cleared everywhere is not harmful because the etching process is self limiting, that is, the selective nature of the etching process causes etching to stop when it reaches the material of layer 12 and the anisotropic feature insures that there is little undercutting of portion 13b. Clearing the various parts of portion 13a on different parts of substrate 11 is important in order that underlying region 12a of layer 12 may be uniformly etched (in a subsequent step) without regard to its position on substrate 11. The selective nature of the etching method makes the process insensitive to local varations in the etch rate across substrate 11. This avoids a difficulty present in some prior art approaches. Mask portion 15b is then conveniently removed by means well known in the art.

Lower first conductor layer 12 must be patterned to provide the particular interconnect arrangement which is desired. This patterning is carried out by conventional techniques well known in the art. The patterning of layer 12 may be carried out before deposition of layer 13 or any time before the application of layer 16 (FIG. 2F). Layer 12 is conveniently patterned after mask 15b has been removed (FIG. 2E). Masking layer 18, for example of photoresist, is patterned to provide opening 18a above portion 12b of layer 12 and protective mask 18b elsewhere. Portion 12b is then removed to define separated portions 12a of layer 12. Conductor portions 12a in FIGS. 2E–H correspond to conductors 121–122 of FIGS. 1A–C. RIE is a suitable etching technique for removing portion 12b of layer 12. Mask 18b is then removed.

Dielectric planarizing layer 16 is then applied over the exposed portions of substrate 11 and layers 12, 13, and 14. Layer 16 must have thickness 19a over conductor layer 12 which is a least equal to height 20 of conductive pillar 21. Pillar 21 is composed of portions 14b and 13b of layers 14 and 13 and has height 20 substantially equal to the sum of the thicknesses of layers 13 and 14. This is because regions 14b and 13b were protected during etching so that top surface 14d of portion 14b remains undisturbed.

Layer 16 must be formed, at least in part, of a material that exhibits planarizing characteristics, that is, which takes on first thickness 19a above region 12a of layer 12 which is greater than second thickness 19b above pillar 21. The action of a planaraizing layer is to smooth out asperities and steps in the surface features of an electrical device or circuit so that subsequent layers (e.g., upper metal layer 17 in FIG. 2H) do not encounter sharp steps or fissues which might degrade yield, reliability, or performance. Layer 16 must also be formed, at least in part, of a material which is an electrical insulator since part 16b of layer 16 acts as the insulating dielectric separating the multiple conductor layers (e.g., layers 12 and 17 in FIG. 2H).

Polyimide is a known dielectric planarizing material. Polyimide materal type PIQ-13 manufactured by Hitachi, Ltd., Tokyo, Japan has been found suitable. Other polyimides, such as those manufactured by E.I. Dupont Co., Inc., of Wilmington, Del. are also believed to be suitable. The polyimide is applied using a spinner and cured according to the manufacturer's directions. Other materials such as spin-on glass and phosphorous doped glass are also believed to be useful as planarizing layers. Such glasses are well known in the art.

Figure 2G:
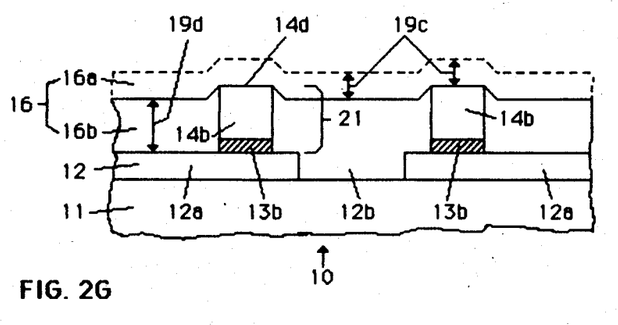
Figure 2H:
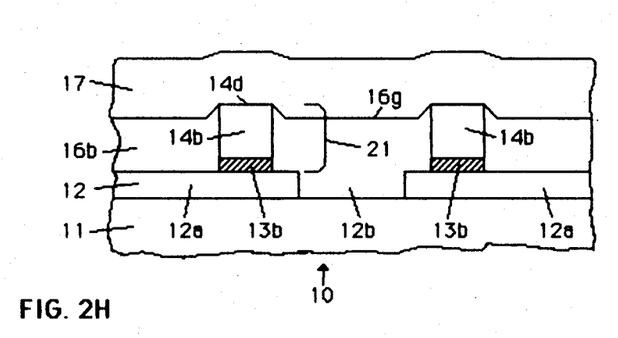

Planarizing layer 16 is then etched as illustrated in FIG. 2G to remove portion 16a until top 14d of pillar 21 is exposed. It is important that the etching of layer 16 be reasonably uniform, that is, substantially the same thickness 19c of material should be removed from above pillar 21 as above region 12a or 12b. While some departure from perfect uniformity can be tolerated, it is essential that top 14d of pillar 21 be exposed and that remaining thickness 19d of portion 16b of layer 16 above layer 12 be sufficient for isolating conductors 12 and 17.

Figure 3A:
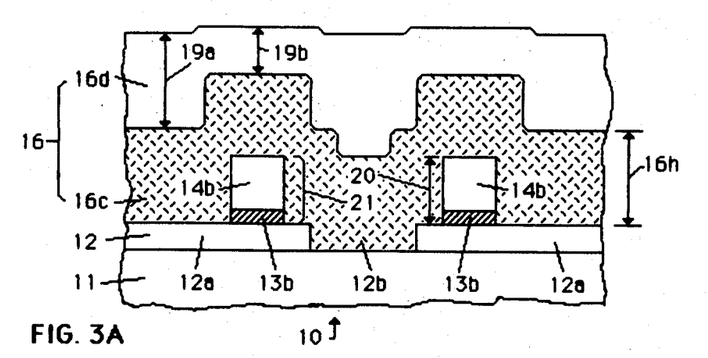
FIGS. 3A-C are cross-sections similar to FIGS. 2F-H, but according to an alternative embodiment.
Figure 3B:
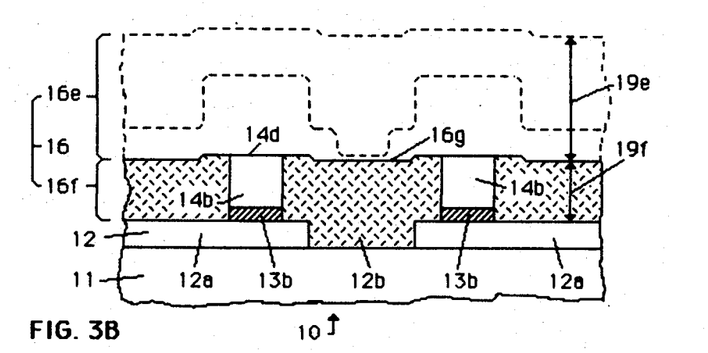
Figure 3C:
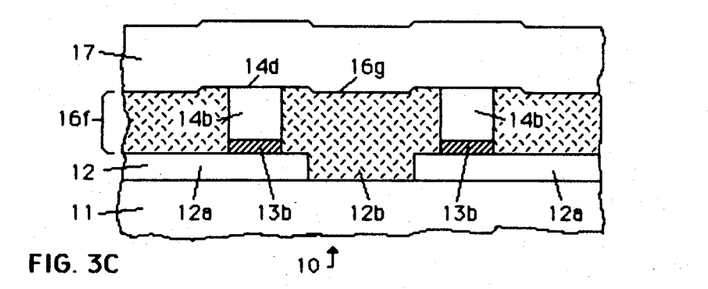

Alternatively, layer 16 may be formed from two sequential layers 16c-d (see FIGS. 3A-C). For example, layer 16 is formed from oxide insulating layer 16c covered by photoresist layer 16d. Photoresist is another known planarizing material. Oxide layer 16c is shown cross-hatched in FIGS. 3A-C. Oxide layer 16c need not have planarizing characteristics and can conformally coat substrate 11, layer 12, and pillar 21. It is desirable that oxide layer 16c has thickess 16h at least equal to pillar height 20 and an etch rate comparable to the etch rate of superposed resist layer 16d. If the resist and the oxide etch at substantially the same rate then the planarized shape of resist layer 16d is transferred to underlying oxide layer 16c. RIE is a known means for simultaneously etching resist and oxide. Portion 16e having thickness 19e of layer 16 is removed (FIG. 3B), leaving planarized oxide portion 16f of thickness 19f to serve as the insulating dieletric between metal layers 12 and 17 (FIG. 3C). This sequence illustrated in FIGS. 3A-C has the advantages that there is no need to do a cure step as with the polyimide, and that insulating oxide 16f can have superior dielectric properties and chemical stability as compared to polyimide region 16b. Other dielectric materials besides oxide can also be used.

Following etching of layer 16 to expose top 14d of pillar 21, upper conductive layer 17 is deposited on top surface 16g of remaining portion 16b or 16f of layer 16 and in contact with top 14d of pillar 21 (FIGS. 2H and 3C). Layer 17 is optionally patterned to form the upper interconnect pattern (FIGS. 1A-C). It is apparent that conductive via or pillar 21 interconnects lower metal layer 12 and upper metal layer 17, that the location of via and pillar 21 is determined by the location of mask 15b, that each metal layer can be separately patterned to provide the desired interconnection routing on each level of wiring, that lateral dimensions 14c of pillar or via 21 can be made comparable to thickness 19d or 19f of interlayer dielectric 16b or 16f, and that the fabrication process avoids harmful etching of lower conductor layer 12 and process induced variations of lateral dimensions 14c of vias and pillars 21.

While the invention has been illustrated in terms of particular device structures those of skill in the art will understand that the principles taught herein also apply to other devices, circuits, and structures. Also, while the invention has been illustrated as if for silicon semiconductor devices or integrated circuits, other semiconductors may be used, and other planar substrates, as for example sapphire or garnet or the like. In addition, the techniques described herein are useful for other types of electronic devices fabricated using planar technology and requiring multiple layers of conductors such as, but not limited to, SOS devices and circuits, bubble devices and circuits, and Josephson devices and circuits. Accordingly, it is intended to include all such variations in the claims which follow.

I claim:

1. A process for interconnecting multiple conductor layers on electronic circuits, comprising:
   providing a substrate having a principal surface; forming a first conductor layer on said principal surface;
   forming a conductive etch-stop layer on said first conductor layer;
   forming on said etch-stop layer a second conductor layer of a material which is selectively removeable with respect to said etch stop layer;
   providing a first masking layer on said second conductor layer having an open region above an exposed first portion of said second conductor layer and a mask region above a covered second portion of said second conductor layer;
   selectively removing said first portion of said second conductor layer to expose a first portion of said etch-stop layer under said open region leaving said second portion of said second conductor layer; removing said first portion of said etch-stop layer to expose a first portion of said first conductor layer under said open region;
   removing said mask region;
   covering any exposed portions of said principal surface, said first conductor layer and said second conductor layer with a dielectric planarizing layer having a first thickness above said first portion of said first conductor layer and a second thickness above said second portion of said second conductor layer and wherein said first thickness is greater than said second thickness;
   removing from said dielectric planarizing layer a first part having at least said second thickness so as to expose said second portion of said second conductor layer, leaving a second part of said dielectric planarizing layer covering said first portion of said first conductor layer; and
   forming a third conductor layer in contact with said second portion of said second conductor layer and said second part of said dielectric planarizing layer.

2. The process of claim 1 wherein said step of forming said etch-stop layer comprises forming said etch-stop layer from a material which is selectively etchable with respect to said first conductor layer.

3. The process of claim 1 wherein said step of forming said etch-stop layer comprises forming said etch-stop layer of a different material than said first conductor layer.

4. The process of claim 1 wherein said first removing step comprises anisotropically removing said first portion of said second conductor layer without substantial undercutting of said second portion of said second conductor layer.

5. The process of claim 1 further comprising, after said step of removing said first portion of said etch-stop layer, the further steps of providing a second masking layer having means for defining a pattern in said first conductor layer, patterning said first conductor layer, and removing said second masking layer.

6. The process of claim 5 wherein said further steps are provided after said step of removing said mask portion.

7. The process of claim 1 wherein said first covering step comprises covering with a dielectric planarizing layer of a polyimide material.

8. The process of claim 1 wherein said step of removing a first part of said dielectric planarizing layer comprises removing said first part by blanket etching or erosion.

9. The process of claim 1 wherein said first covering step comprises applying an insulating oxide layer of substantially uniform thickness and then overcoating said oxide layer with a planarizing layer having said first and second thicknesses.

10. A process for forming multi-layer conductors on electronic devices, comprising:
providing a device having a principal surface;
applying a first conductor layer to said principal surface;
applying to said first conductor layer an intermediate layer of a material which is conductive and selectively etchable with respect to said first conductor layer;
forming on said intermediate layer a second conductor layer of a material which is selectively etchable with respect to said intermediate layer;
protecting said second conductor layer with an etch mask having an open region above a first portion of said second conductor layer and a closed region above a second portion of said second conductor layer;
anisotropically etching said first portion of said second conductor layer to expose a first portion of said intermediate layer under said open region;
etching said first portion of said intermediate layer to expose a first portion of said first conductor layer under said open region;
removing said etch mask;
patterning said first portion of said first conductor layer;
covering said device with a dielectric layer having a first thickness above said first portion of said first conductor layer and a second thickness above said second portion of said second conductor layer and wherein said second thickness is less than said first thickness;
unformly removing a first part of said dielectric layer of at least said second thickness to expose said second portion of said second conductor layer, leaving a second part of said dielectric layer covering said first portion of said first conductor layer; and
forming on said second part of said dielectric layer a third conductor layer in contact with said second portion of said second conductor layer.

11. The process of claim 10 wherein said first and second conductor layers are of the same material.

12. The process of claim 10 wherein said step of anisotropically etching said first portion of said second conductor layer is performed selectively with etching means which removes the material of said second conductive layer at a higher rate than it removes the material of said intermediate layer.

13. The process of claim 10 wherein said step of etching said first portion of said intermediate layer is performed selectively with etching means which removes the material of said intermediate layer at a higher rate than it removes the material of said first conductor layer.

14. The process of claim 10 wherein said dielectric layer is a double layer having a lower insulating portion and an upper planarizing portion.

15. A process for forming multi-layer conductors on electronic devices, comprising:
providing a first conductor layer on said electronic device;
providing a second conductor layer above said first conductor layer;
providing between said first and second conductor layers an intermediate layer of a conductive material that is selectively etchable with respect to said first conductor layer and that is adapted to act as an etch stop during etching of said second conductor layer;
protecting said second conductor layer with an etch mask having an open region above a first portion of said second conductor layer and a closed region above a second portion of said second conductor layer;
selectively etching said first portion of said second conductor layer to expose a first portion of said intermediate layer under said open region;
etching said first portion of said intermediate layer to expose a first portion of said first conductor layer under said open region;
removing said etch mask;
patterning said first portion of said first conductor layer;
covering said device with a dielectric layer having a first thickness above said first portion of said first conductor layer and a second thickness above said second portion of said second conductor layer and wherein said second thickness is less than said first thickness;
unformly removing a first part of said dielectric layer of at least said second thickness to expose said second portion of said second conductor layer, leaving a second part of said dielectric layer covering said first portion of said first conductor layer; and
forming on said second part of said dielectric layer a third conductor layer in contact with said second portion of said second conductor layer.

16. The process of claim 15 wherein said first conductor layer and said second conductor layer are of the same material.

17. The process of claim 15 wherein said step of etching said first portion of said intermediate layer comprises removing said first portion of said intermediate layer with an etching means which does not substantially etch said second part of said second conductor layer.

18. A process for forming pillar-shaped vias between multi-layer conductors on electronic devices, comprising:
providing a first conductor layer on said electronic device;
providing a second conductor layer above said first conductor layer;
providing between said first and second conductor layers an intermediate layer of a conductive material which is selectively etchable with respect to said first conductor layer by a first etching means and which acts as an etch stop during etching of said second conductor layer by a second etching means;
protecting said second conductor layer with an etch mask having an open region above a first portion of said second conductor layer and a closed region above a second portion of said second conductor layer;
anisotropically etching said first portion of said second conductor layer with said second etching means to expose a first portion of said intermediate layer under said open region and leave a second portion of said second conductor layer material under said etch mask;
etching said first portion of said intermediate layer with said first etching means to expose a first portion of said first conductor layer under said open region and leave a second portion of said intermediate layer under said etch mask, wherein said second portions of said second conductor layer and said intermediate layer form a pillar shaped column adapted to act as a conductive via;

removing said etch mask;

patterning said first portion of said first conductor layer;

covering said device with a dielectric layer having a first thickness above said first portion of said first conductor layer and a second thickness above said pillar-shaped via formed from said second conductor layer and said intermediate layer and wherein said second thickness is less than said first thickness;

uniformly removing a first part of said dielectric layer of at least said second thickness but less than said first thickness to expose the top of said via, leaving a second part of said dielectric layer covering said first portion of said first conductor layer; and forming on said second part of said dielectric layer a third conductor layer in contact with the top of said via.

19. The process of claim 18 wherein said intermediate layer is selectively etchable with respect to both said first and second conductor layers.

20. The process of claim 18 wherein said first conductor layer and said second conductor layer are of the same material.

21. The process of claim 18 wherein said dielectric layer is formed as a double layer comprising a first insulating part of substantially uniform thickness and a second planarizing part above said insulating part of non-uniform thickness so as to make said first and second thicknesses unequal.

22. The process of claim 21 wherein said uniform thickness equals or exceeds the height of said via above said first conductor.

* * * * *